(12) United States Patent
Choi et al.

(10) Patent No.: US 8,198,631 B2
(45) Date of Patent: Jun. 12, 2012

(54) DISPLAY DEVICE AND METHOD OF FABRICATING THE SAME

(75) Inventors: Hee-Dong Choi, Gumi-si (KR); Hye-Young Choi, Seoul (KR); Jun-Min Lee, Daegu (KR)

(73) Assignee: LG Display Co., Ltd., Seoul (KR)

( * ) Notice: Subject to any disclaimer, the term of this patent is extended or adjusted under 35 U.S.C. 154(b) by 183 days.

(21) Appl. No.: 12/813,308

(22) Filed: Jun. 10, 2010

(65) Prior Publication Data

US 2011/0018000 A1     Jan. 27, 2011

(30) Foreign Application Priority Data

Jul. 23, 2009   (KR) .................. 10-2009-0067410

(51) Int. Cl.
  *H01L 29/04*  (2006.01)
  *H01L 21/336*  (2006.01)
(52) U.S. Cl. ............ 257/59; 257/72; 257/E29.285; 257/E21.414; 438/34; 438/158
(58) Field of Classification Search ............. 257/59, 257/72, E33.053, E29.273, E29.285, E21.411, 257/E21.414; 438/34, 158
See application file for complete search history.

(56) References Cited

U.S. PATENT DOCUMENTS

2003/0127649 A1*  7/2003  Chae ........................ 257/72
2009/0095957 A1*  4/2009  Miyake et al. .............. 257/59

* cited by examiner

*Primary Examiner* — Wensing Kuo (74) *Attorney, Agent, or Firm* — McKenna Long & Aldridge, LLP (57) ABSTRACT

Disclosed is a method of fabricating a display device that includes forming a buffer layer; forming a gate electrode of extrinsic polycrystalline silicon, a gate insulating layer, an active layer of intrinsic polycrystalline silicon and an auxiliary active layer of intrinsic amorphous silicon on the buffer layer; forming an ohmic contact layer of extrinsic amorphous silicon and contacting the auxiliary active layer, source and drain electrodes and a data line; patterning a first passivation layer, an insulating interlayer and the gate insulating layer to form a gate contact hole exposing the gate electrode; forming a gate line on the first passivation layer, made of a metal material, and contacting the gate electrode through the gate contact hole; forming a second passivation layer on the gate line; patterning the first and second passivation layers to form a drain contact hole exposing the drain electrode; and forming a pixel electrode on the second passivation layer in the pixel region and contacting the drain electrode through the drain contact hole.

10 Claims, 8 Drawing Sheets

DISPLAY DEVICE AND METHOD OF FABRICATING THE SAME

The present invention claims the benefit of Korean Patent Application No. 10-2009-0067410, filed in Korea on Jul. 23, 2009, which is hereby incorporated by reference for all purposes as if fully set forth herein.

BACKGROUND OF THE INVENTION

1. Field of the Invention

The present invention relates to a display device, and more particularly, to a display device and a method of fabricating the same.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panels (PDPs), field emission displays, and electro-luminescence displays (ELDs), as a substitute for CRTs. Of these flat panel displays, LCD devices have many advantages, such as high resolution, light weight, thin profile, compact size, and low voltage power supply requirements.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field into the direction of the induced electric field, thereby changing the light transmissivity of the LCD device. Thus, the LCD device displays images by varying the intensity of the induced electric field.

Figure 1:
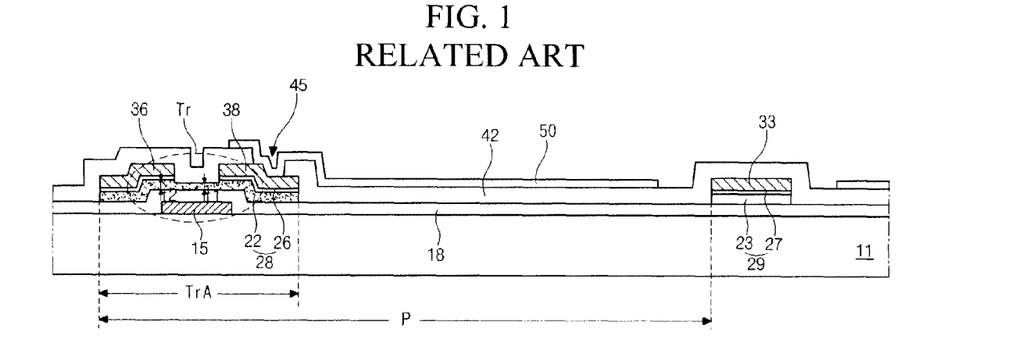
FIG. 1 is a cross-sectional view illustrating an array substrate of an LCD device according to the related art.

FIG. 1 is a cross-sectional view illustrating an array substrate of an LCD device according to the related art.

Referring to FIG. 1, the array substrate includes a gate line (not shown) and a data line 33 crossing each other on a substrate 11 to define a pixel region P. A thin film transistor Tr is formed in a switching region TrA of the pixel region P.

The thin film transistor Tr includes a gate electrode 15, a gate insulating layer 18 on the gate electrode 15, a semiconductor layer 28 on the gate insulating layer 18, and source and drain electrodes 36 and 38 on the semiconductor layer 28. The semiconductor layer 28 includes an active layer 22 made of intrinsic amorphous silicon and an ohmic contact layer 26 made of extrinsic amorphous silicon.

A passivation layer 42 is on the data line 33 and the source and drain electrodes 36 and 38 and includes a drain contact hole 45 exposing the drain electrode 38. A pixel electrode 50 is on the passivation layer 42 and contacts the drain electrode 38 through the drain contact hole 45.

A semiconductor pattern 29 is formed below the data line 33 and includes first and second patterns 23 and 27 made of the same materials as the active layer 22 and the ohmic contact layer 26, respectively.

In the related art, thickness of the active layer 22 is according to position. In other words, a portion of the active layer 22 between the source and drain electrodes 36 and 38 has a first thickness t1, and another portion of the active layer 22 below the ohmic contact layer 26 has a second thickness t2 greater than the first thickness t1. This thickness difference is made by manufacturing processes of the array substrate and causes property degradation of the thin film transistor Tr.

FIGS. 2A to 2E are cross-sectional views illustrating processes of forming the semiconductor layer and the source and drain electrodes. For brevity of explanation, the gate electrode and the gate insulating layers are omitted in the drawings.

Figure 2A:
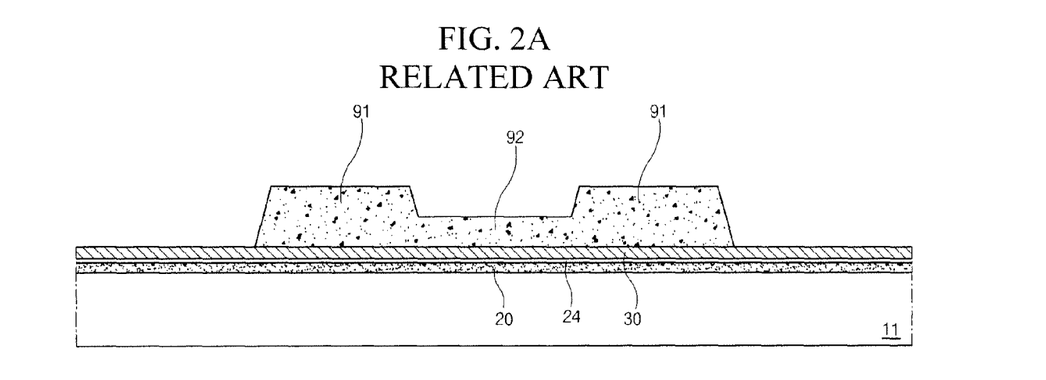
FIGS. 2A to 2E are cross-sectional views illustrating processes of forming the semiconductor layer and the source and drain electrodes.

Referring to FIG. 2A, an intrinsic amorphous silicon layer 20, an extrinsic amorphous silicon layer 24 and a metal layer 30 are sequentially formed on the substrate 11. Then, a photoresist layer is formed on the metal layer 30, exposed to light through a photo mask, and developed to form first and second photoresist patterns 91 and 92. The photoresist patterns 91 and 92 have third and fourth thicknesses, respectively, and the fourth thickness is less than the third thickness.

Figure 2B:
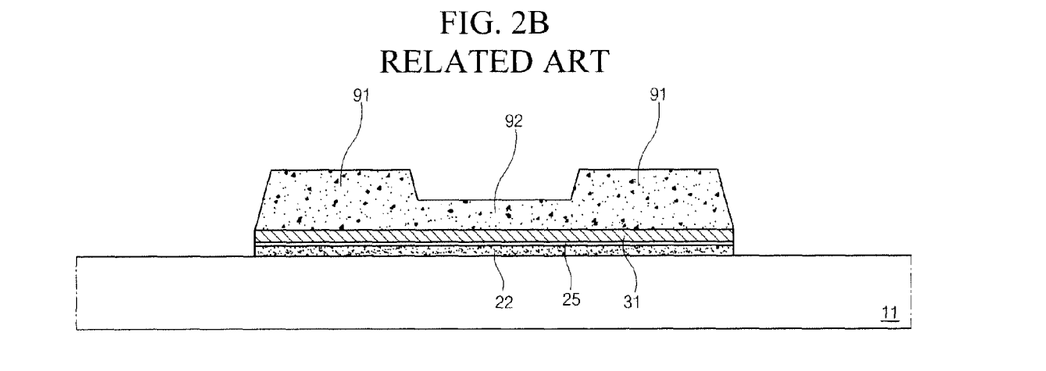

Referring to FIG. 2B, the metal layer 30, the extrinsic amorphous silicon layer 24, and the intrinsic amorphous silicon layer 20 are etched using the photoresist patterns 91 and 92 as an etching mask to form a source-drain pattern 31, an extrinsic amorphous silicon pattern 25 and an active layer 22.

Figure 2C:
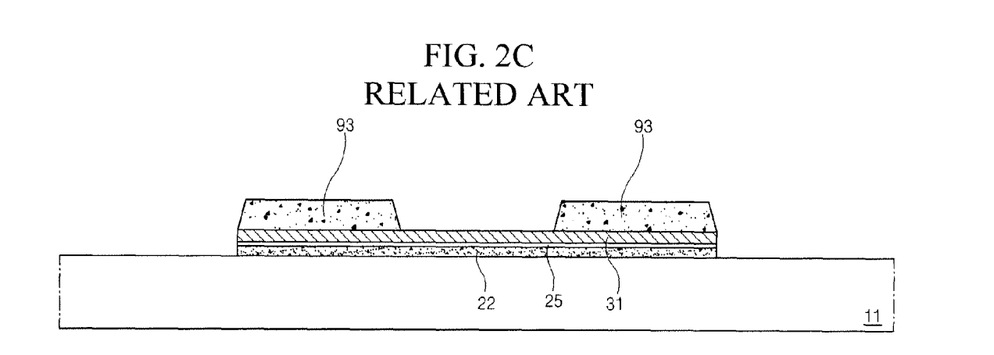

Referring to FIG. 2C, an ashing process is performed to remove the second photoresist pattern 92. Further, through the ashing process, the thickness of the first photoresist pattern 91 is reduced. This first photoresist pattern 91 is referred to as a third photoresist pattern 93.

Figure 2D:
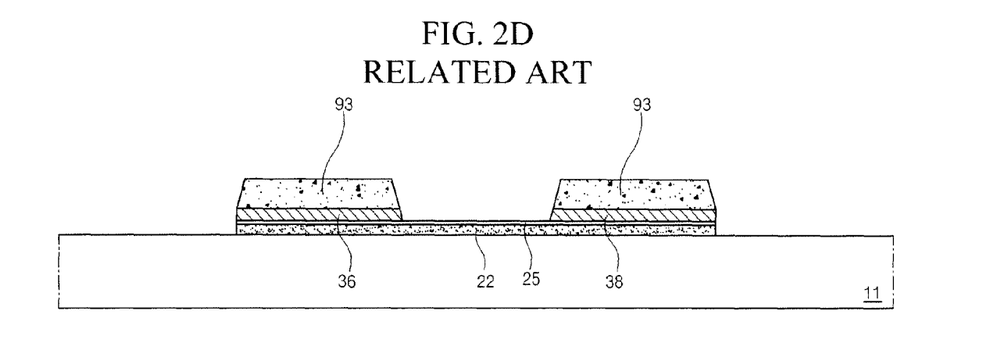

Referring to FIG. 2D, the source-drain pattern 31 is etched using the third photoresist pattern 93 to form source and drain electrodes 36 and 38 spaced apart from each other. Accordingly, the extrinsic amorphous silicon pattern 25 is exposed between the source and drain electrodes 36 and 38.

Figure 2E:
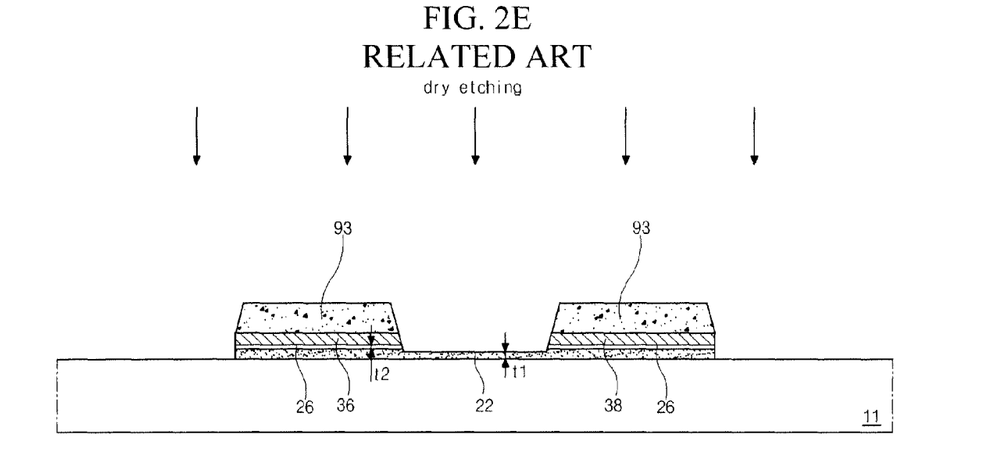

Referring to FIG. 2E, a dry etching process is performed to remove a portion of the extrinsic amorphous silicon pattern 25 between the source and drain electrodes 36 and 38. Accordingly, an ohmic contact layer 26 is formed below the source and drain electrodes 36 and 38.

The dry etching process continues long enough to completely remove the portion of the extrinsic amorphous silicon pattern 25 between the source and drain electrodes 36 and 38. This causes a portion of the active layer 22 below the dry-etched portion of the extrinsic amorphous silicon pattern 25 to be partially removed. Accordingly, the thickness difference of the active layer 22 exits (t1≠t2), and thus property of the thin film transistor is degraded.

In consideration of the thickness of the removed portion of the active layer 22, a method of forming the intrinsic amorphous silicon layer 20 relatively thickly, for example, having 1000 angstroms (Å) or more is proposed. However, this causes deposition time increase of the intrinsic amorphous silicon layer 20, and thus production efficiency is reduced.

Further, since the active layer 22 is made of the amorphous silicon, the thin film transistor has some problems in property. In other words, when the active layer 22 is exposed to light or when an electric field is applied, a state of the active layer 22 changes into a meta-stable state and thus the thin film transistor has problem in stability. Further, carrier mobility of the active layer 22 is low, for example, 0.1 $cm^2/V \cdot s$ to 1.0 $cm^2/V \cdot s$, thus the thin film transistor is not suitable as an element for a driving circuit.

To resolve the above problems, proposed is a method of crystallizing amorphous silicon using a laser device into polycrystalline silicon and fabricating a thin film transistor using the polycrystalline silicon as an active layer.

Figure 3:
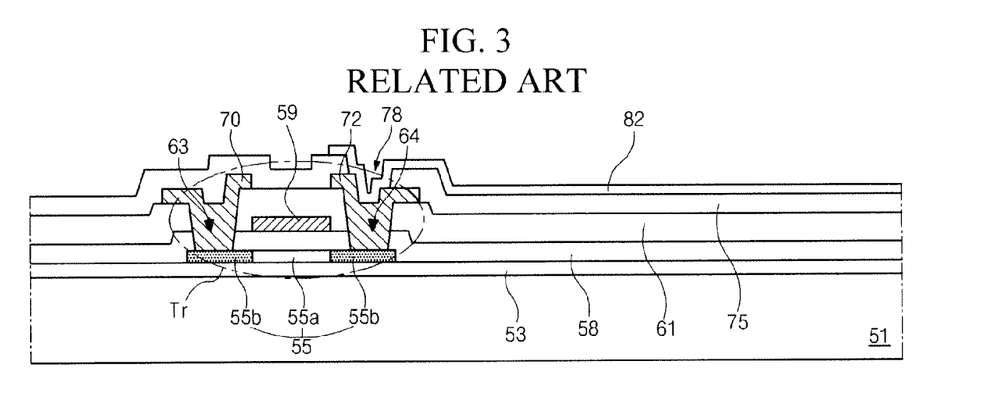
FIG. 3 is a cross-sectional view illustrating an array substrate using a polycrystalline silicon in a pixel region according to the related art.

FIG. 3 is a cross-sectional view illustrating an array substrate using a polycrystalline silicon in a pixel region according to the related art.

Referring to FIG. 3, a thin film transistor Tr includes a semiconductor layer 55 made of polycrystalline silicon on a substrate 51. The semiconductor layer 55 needs a first region 55a made of intrinsic silicon, and a second region 55b at both sides of the first region 55a and doped with n+ ions or p+ ions. Accordingly, ion doping process is required for the second region 55b, and also, a device to dope the n+ or p+ ions is additionally required. This causes increase of production costs, and production line is newly set up due to the additional device.

SUMMARY OF THE INVENTION

Accordingly, the present invention is directed to a display device and a method of fabricating the same which substantially obviates one or more of the problems due to limitations and disadvantages of the related art.

An advantage of the present invention is to provide a display device and a method of fabricating the same that can improve reliability and property of a thin film transistor, reduce production costs, and simplify production processes.

Additional features and advantages of the present invention will be set forth in the description which follows, and in part will be apparent from the description, or may be learned by practice of the invention. These and other advantages of the invention will be realized and attained by the structure particularly pointed out in the written description and claims thereof as well as the appended drawings.

To achieve these and other advantages and in accordance with the purpose of the present invention, as embodied and broadly described herein, a method of fabricating a display device includes forming a buffer layer on a substrate and made of an inorganic insulating material; forming a gate electrode, a gate insulating layer, an active layer and an auxiliary active layer sequentially disposed on the buffer layer, wherein the gate electrode and the gate insulating layer have substantially the same shape and area in plane, wherein the active layer and the auxiliary active layer have substantially the same shape and area in plane, wherein side portions of the gate insulating layer are not covered by the active layer, wherein the gate electrode is made of extrinsic polycrystalline silicon, wherein the active layer is made of intrinsic polycrystalline silicon, and wherein the auxiliary active layer is made of intrinsic amorphous silicon; forming an insulating interlayer on the auxiliary active layer and made of an inorganic insulating material, wherein the insulating interlayer includes an active contact hole exposing each of both side portions of the auxiliary active layer; forming an ohmic contact layer, source and drain electrodes and a data line, wherein the ohmic contact layer is made of extrinsic amorphous silicon and contacts each of the both side portions of the auxiliary active layer, wherein each of the source and drain electrodes is on the ohmic contact layer, and wherein the data line is on the insulating interlayer; forming a first passivation layer on the source and drain electrodes and the data line; patterning the first passivation layer, the insulating interlayer and the gate insulating layer to form a gate contact hole exposing the gate electrode; forming a gate line on the first passivation layer, made of a metal material, crossing the data line to define a pixel region, and contacting the gate electrode through the gate contact hole; forming a second passivation layer on the gate line; patterning the first and second passivation layers to form a drain contact hole exposing the drain electrode; and forming a pixel electrode on the second passivation layer in the pixel region and contacting the drain electrode through the drain contact hole.

In another aspect, a display device includes a buffer layer on a substrate and made of an inorganic insulating material; a gate electrode and a gate insulating layer sequentially disposed on the buffer layer and having substantially the same shape and area in plane, wherein the gate electrode is made of extrinsic polycrystalline silicon; an active layer and an auxiliary active layer sequentially disposed on the gate insulating layer and having substantially the same shape and area in plane, wherein side portions of the gate insulating layer are not covered by the active layer, wherein the active layer is made of intrinsic polycrystalline silicon, and wherein the auxiliary active layer is made of intrinsic amorphous silicon; an insulating interlayer on the auxiliary active layer, wherein the insulating interlayer includes an active contact hole exposing each of both side portions of the auxiliary active layer; an ohmic contact layer contacting each of the both side portions of the auxiliary active layer and made of extrinsic amorphous silicon; source and drain electrodes on each of the ohmic contact layer; a data line on the insulating interlayer; a first passivation layer on the source and drain electrodes and the data line and including a gate contact hole exposing the gate electrode; a gate line on the first passivation layer, crossing the data line to define a pixel region, and contacting the gate electrode through the gate contact hole; a second passivation layer on the gate line and including a drain contact hole exposing the drain electrode; and a pixel electrode on the second passivation layer in the pixel region and contacting the drain electrode through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 4A:
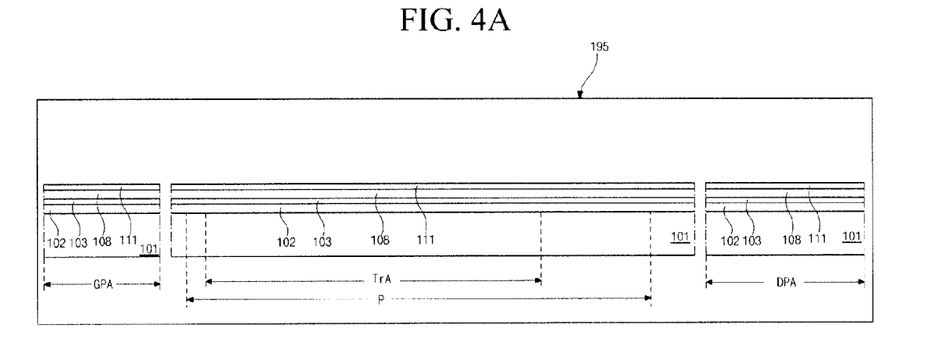
FIGS. 4A to 4N are cross-sectional views illustrating a method of fabricating an array substrate of an LCD device according to an embodiment of the present invention.
Figure 4B:
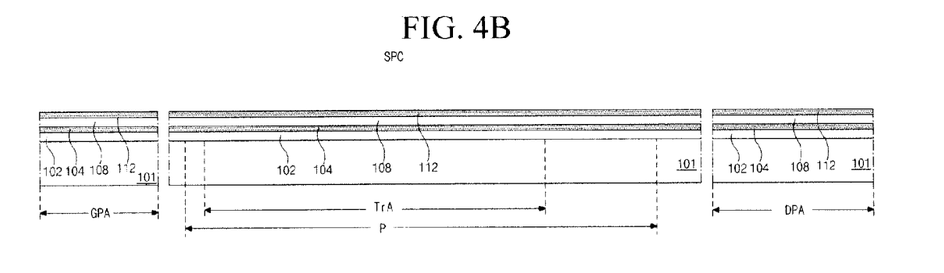
Figure 4C:
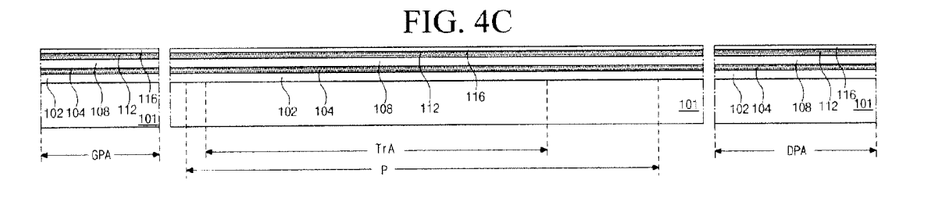
Figure 4D:
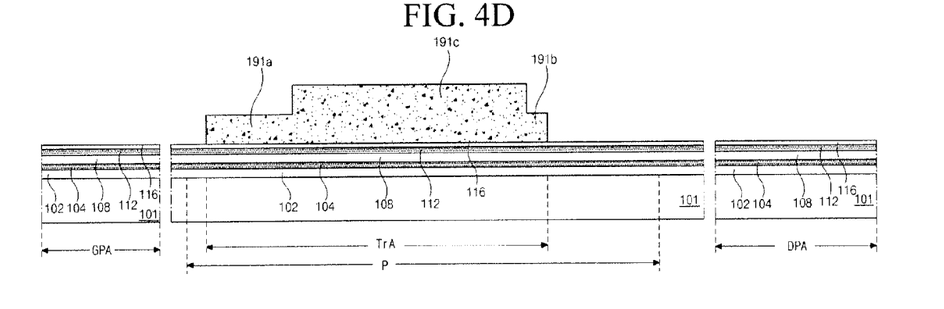
Figure 4E:
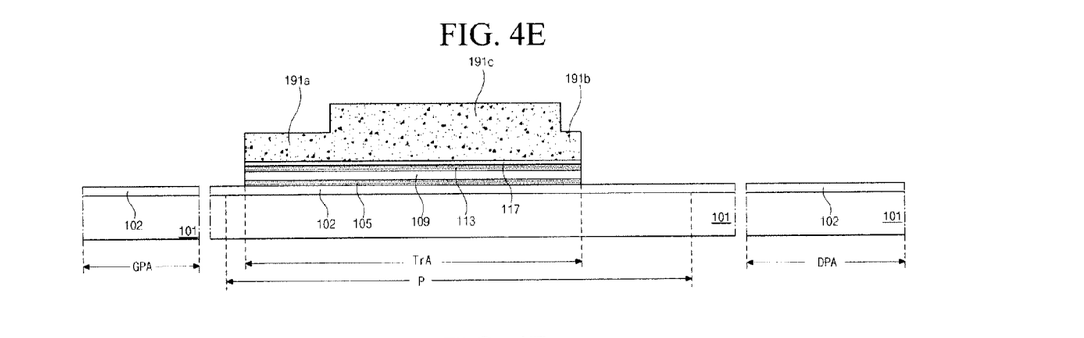
Figure 4F:
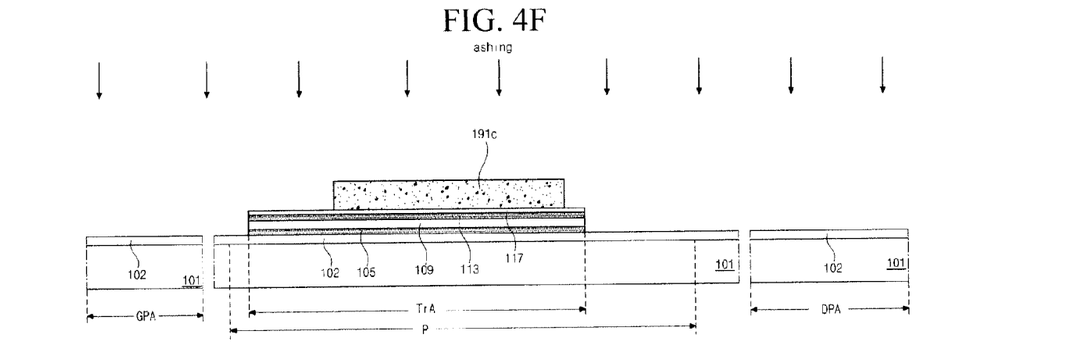
Figure 4G:
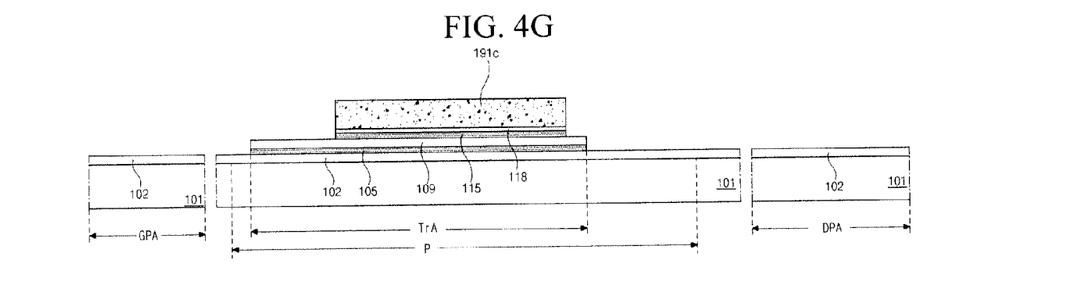
Figure 4H:
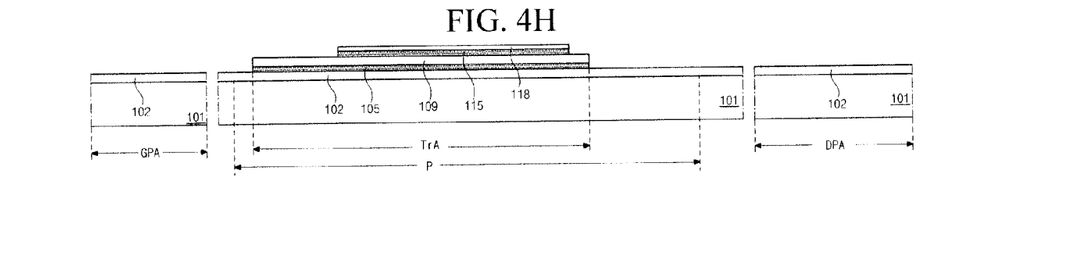
Figure 4I:
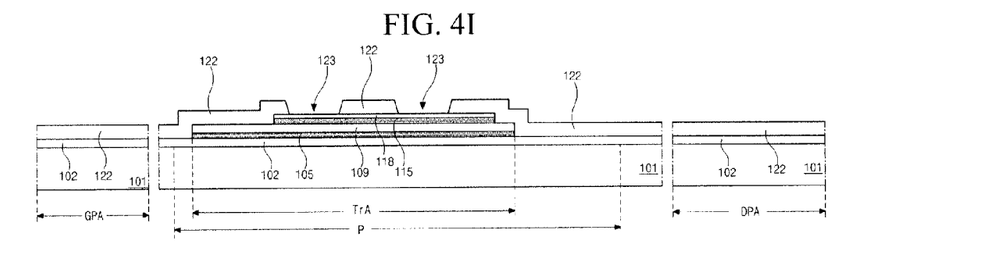
Figure 4J:
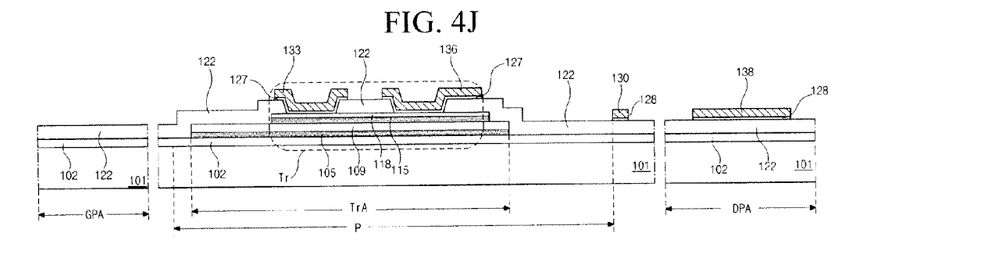
Figure 4K:
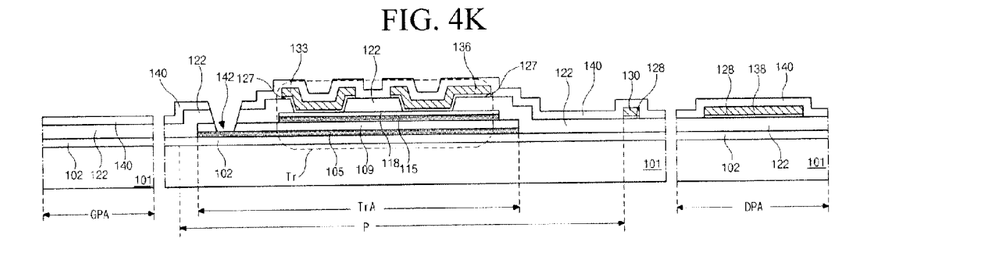
Figure 4L:
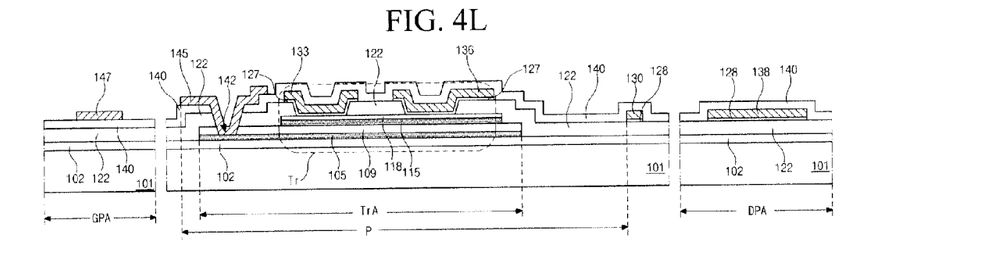
Figure 4M:
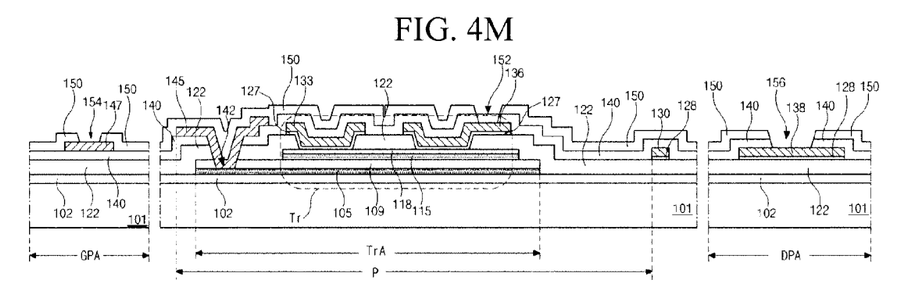
Figure 4N:
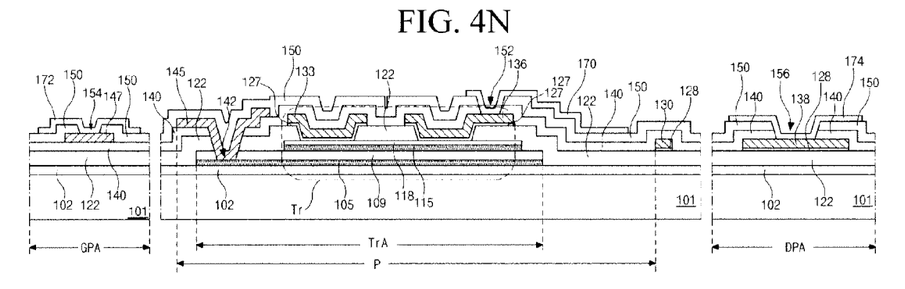

FIGS. 4A to 4N are cross-sectional views illustrating a method of fabricating an array substrate of an LCD device according to an embodiment of the present invention.

In the drawings, a pixel region P, a switching region TrA, a gate pad region GPA and a data pad region DPA are defined in the array substrate.

Referring to FIG. 4A, a buffer layer 102 is formed on a substrate 101. The buffer layer 102 may be made of an inorganic insulating material that includes silicon oxide ($SiO_2$) and silicon nitride (SiNx) but not limited thereto. The buffer layer 102 may have a thickness of about 1000 Å to about 3000 Å. In the embodiment, a solid phase crystallization (SPC) method is employed for crystallization. When the SPC method is performed in a high temperature condition, for example, of about 600° C. to about 800° C. In this case, alkali ions are emitted from the substrate 101 and may cause property of crystalline silicon. To prevent this, the buffer layer 102 is formed on the substrate 101 in advance.

Then, a first extrinsic amorphous silicon layer 103 is formed on the buffer layer 102. The first extrinsic amorphous silicon layer 103 may have a thickness of about 500 Å to about 1000 Å. A first inorganic insulating layer 108 is formed on the first extrinsic amorphous silicon layer 103. The first inorganic insulating layer 108 may be made of silicon oxide ($SiO_2$). The first inorganic insulating layer 108 may have a thickness of about 500 Å to about 4000 Å.

A first intrinsic amorphous silicon layer 111 is formed on the first inorganic insulating layer 108. The first intrinsic amorphous silicon layer 111 may have a thickness of 300 Å to about 1000 Å. As described in the related art, the intrinsic amorphous silicon layer is formed to have a thickness of about 1000 Å or more in consideration that it is partially removed during the dry etching process for formation of the ohmic contact layer. However, in the embodiment, the first intrinsic amorphous silicon layer 111 becoming an active layer (115 of FIG. 4G) is not partially removed, as described below. Accordingly, reduction of the thickness of the active layer 115 is prevented. Accordingly, it may be suitable that the first intrinsic amorphous silicon layer 111 is formed to have the thickness i.e., about 300 Å to about 1000 Å. Accordingly, production costs and time can be reduced.

The above-described layers 102, 103, 108 and 111 may be formed in the same vacuum chamber 195 of the same deposition apparatus, for example, a CVD (chemical vapor deposition) apparatus. For example, the layers 102, 103, 108 and 111 are sequentially formed by adaptively changing reaction gases in the same vacuum chamber 195 without exposure to an atmospheric condition.

Referring to FIG. 4B, the first intrinsic amorphous silicon layer 111 is crystallized through the SPC process to improve property thereof, for example, mobility. Accordingly, the first intrinsic amorphous silicon layer 111 becomes an intrinsic polycrystalline silicon layer 112. The SPC process may be a thermal crystallization process that a thermal treatment is performed in a temperature condition of about 600° C. to about 80° C., or an alternating magnetic field crystallization process that an alternating magnetic field crystallization apparatus is used in a condition of about 600° C. to about 700° C.

Through the SPC process, the first extrinsic amorphous silicon layer 103 is also crystallized into an extrinsic polycrystalline silicon layer 104. Accordingly, conductivity of the extrinsic silicon can be also improved.

Then, a cleaning process, for example, a BOE (buffered oxide etch) cleaning process may be performed for the substrate 101 having the intrinsic polycrystalline silicon layer 112. Through the cleaning process, a thermal oxide film formed at a surface of the intrinsic polycrystalline silicon layer 112 can be removed. In other words, when the SPC process is performed in a state that any material is not formed on the first intrinsic amorphous silicon layer 111, the thermal oxide film is caused due to the SPC process. This thermal oxide film adversely affects an ohmic property when it contacts a second intrinsic amorphous silicon layer (116 of FIG. 4C) to be formed later. Accordingly, it is preferred that the thermal oxide film is removed. To do this, the cleaning process is performed.

Referring to FIG. 4C, the second intrinsic amorphous silicon layer 116 is formed on the intrinsic polycrystalline silicon layer 112 without the thermal oxide film. The second intrinsic amorphous silicon layer 116 may have a thickness of about 50 Å to about 300 Å. The second intrinsic amorphous silicon layer 116 is for improving a contact property with an ohmic contact layer (127 of FIG. 4J) made of extrinsic amorphous silicon to be formed later and an off-current property.

In more detail, in later processes, the intrinsic polycrystalline silicon layer 112 is patterned into the active layer 115, and the ohmic contact layer 127 made of extrinsic amorphous silicon is formed on the active layer 115. The intrinsic polycrystalline silicon is adhered to the intrinsic amorphous silicon better than the extrinsic amorphous silicon. Accordingly, the second intrinsic amorphous silicon layer 116 is formed on the intrinsic polycrystalline silicon layer 112. Therefore, an adhesion with the ohmic contact layer 127 can be improved and a contact resistance with the ohmic contact layer 127 can be reduced.

Further, in later processes, the second intrinsic amorphous silicon layer 116 is patterned into an auxiliary active layer (118 of FIG. 4G). For example, a channel is not needed to be formed in the auxiliary active layer 118 when a thin film transistor (Tr of FIG. 4J) is turned on, but the auxiliary active layer 118 functions dominantly as an element to reduce an off current of the thin film transistor Tr in a stat that the thin film transistor Tr is turned off. Accordingly, the auxiliary active layer 118 is not needed to have a thickness of about 300 Å to 1000 Å which is required for a role as the active layer, and rather, the auxiliary active layer 115 has the thickness of about 50 Å to about 300 Å such that it acts as an element to reduce the off current as well as to improve the contact property.

Referring to FIG. 4D, a photoresist layer is formed on the second intrinsic amorphous silicon layer 116. Then, the photoresist layer is exposed to light using a light diffraction mask or halftone mask. Each of the light diffraction mask and the halftone mask includes a transmissive portion, a blocking portion, and a semi-transmissive portion. The semi-transmissive portion of the light diffraction mask may include a plurality of slits to adjust transmissivity of light passing therethrough, and the semi-transmissive portion of the halftone mask may include a plurality of coated films to adjust transmissivity of light passing therethrough. After the light exposure, the photoresist layer is developed to form first to third photoresist patterns 191a to 191c.

The third photoresist pattern 191c corresponds to a portion of a region where a gate electrode (105 of FIG. 4E) to be formed later is located. In other words, the third photoresist pattern 191c corresponds to a region where the active layer 115 is located. The first and second photoresist patterns 191a and 191b correspond to other portions of a region where the gate electrode 105 is located. In other words, the first and second photoresist patterns 191a and 191b correspond to a region where the active layer 115 does not overlap the gate electrode 105. The third photoresist pattern 191c has a second thickness, and the first and second photoresist patterns 191a and 191b has a first thickness less than the second thickness of the third photoresist pattern 191c.

As such, the third photoresist pattern 191c is formed in the region covered by the active layer 115 among the region covered by the gate electrode 105 while the first and second photoresist patterns 191a and 191b are formed in the region not covered by the active layer 115 among the region covered by the gate electrode 105. Further, the photoresist layer located at a region of the substrate 101 except for the region covered by the gate electrode 105 may be removed through the developing process, and thus portions of the second intrinsic amorphous silicon layer 116 except for portions of the second intrinsic amorphous silicon layer 116 below the first to third photoresist patterns 191a to 191c may be exposed.

The first and second photoresist patterns 191a and 191b in the switching region TrA may be different in width. According to the configuration of the photoresist patterns 191a to 191c, side portions of the gate electrode 105, a gate insulating layer (109 of FIG. 4E), the active layer 115, the auxiliary active layer 118 have a step shape, and thus an insulating interlayer (122 of FIG. 4I) to be formed thereon can be prevented from being disconnected or coming off. Further, secured can be an area where a gate contact hole (142 of FIG. 4K) is formed for a contact between a gate line (145 of FIG. 4L) and the gate electrode 105.

Referring to FIG. 4E, the second intrinsic amorphous silicon layer 116, the intrinsic polycrystalline silicon layer 112, the first inorganic insulating layer 108 and the extrinsic polycrystalline silicon layer 104 are etched using the first to third photoresist patterns 191a to 191c to form the gate electrode 105, the gate insulating layer 109, an intrinsic polycrystalline silicon pattern 113 and an intrinsic amorphous silicon pattern 117 in the switching region TrA. Through this etching process, in other regions including the gate and data pad regions GPA and DPA except for the switching region TrA, the second intrinsic amorphous silicon layer 116, the intrinsic polycrystalline silicon layer 112, the first inorganic insulating layer 108 and the extrinsic polycrystalline silicon layer 104 may be completely removed so that the buffer layer 102 may be exposed.

In this embodiment, the gate electrode 105 is made of the extrinsic polycrystalline silicon. This is for preventing a problem produced when the gate electrode 105 is made of a metal material. In more detail, the SPC process requires a high temperature condition of about 600° C. or more, as described above. Accordingly, if the gate electrode were made of the metal material, during the SPC process, this metal gate electrode might be deformed or have spikes that penetrate through the first inorganic insulating layer 108 and contact the intrinsic polycrystalline silicon layer 112. In other words, the high temperature condition for the SPC process causes the metal gate electrode to be defected. Accordingly, it is preferred that the extrinsic polycrystalline silicon is used to form the gate electrode 105.

The extrinsic polycrystalline silicon has a conductivity less than the metal material. Accordingly, the gate electrode 105 is formed to have a thickness of about 500 Å to about 1000 Å so that it has a sheet resistivity is about 150 Ω/sq to about 230 Ω/sq. This resistivity is very close to that of a transparent conductive material, for example, indium-tin-oxide (ITO) or indium-zinc-oxide (IZO). Thus, the gate electrode 105 made of the extrinsic polycrystalline silicon according to the embodiment can sufficiently function as a gate electrode of the thin film transistor Tr.

Referring to FIG. 4F, an ashing process is performed to remove the first and second photoresist patterns 191a and 191b. Due to the ashing process, the thickness of the third photoresist pattern 191c is reduced.

Referring to FIG. 4G, the intrinsic amorphous silicon pattern 117 and the intrinsic polycrystalline silicon pattern 113 are etched using the third photoresist pattern 191c to form the active layer 115 and the auxiliary active layer 118 below the third photoresist pattern 191c. Through the etching process, side portions of the gate insulating layer 109 below the removed first and second photoresist patterns 191a and 191b are exposed. The exposed side portions of the gate insulating layer 109 are different in width with respect to the third photoresist pattern 191c. The gate line 145 may correspond to the wider exposed side portion of the gate insulating layer 109. The active layer 115 is made of the intrinsic polycrystalline silicon, and the auxiliary active layer 118 is made of the intrinsic amorphous silicon.

Referring to FIG. 4H, a stripping process is performed to remove the third photoresist pattern 191c. Accordingly, the auxiliary active layer 118 is exposed.

Referring to FIG. 4I, a second inorganic insulating layer 122 is formed on the substrate 101 having the auxiliary active layer 118. The second inorganic insulating layer 122 may have a single-layered structure by depositing an inorganic insulating material, for example, silicon oxide ($SiO_2$) or silicon nitride (SiNx), or double-layered structure by sequentially depositing inorganic insulating materials, for example, silicon oxide ($SiO_2$) and silicon nitride (SiNx).

It is preferred that the second inorganic insulating layer 122 has a thickness more than a total thickness of the gate electrode 105 and the gate insulating layer 109. This is for making the second inorganic insulating layer 122 prevented from being disconnected at the step portion of the gate electrode 105 and the gate insulating layer 109 with respect to the buffer layer 102. Since the total thickness of the gate electrode 105 and the gate insulating layer 109 is more than the active layer 115 and the auxiliary active layer 118, when the second insulating layer 122 has the thickness more than the total thickness of the gate electrode 105 and the gate insulating layer 109, prevented can be the disconnection of the second inorganic insulating layer 122 at the step portion of the active layer 115 and the auxiliary active layer 118.

The thickness of the gate electrode 105 is about 500 Å to about 1000 Å, and the thickness of the gate insulating layer is about 500 Å to about 4000 Å. Accordingly, it is preferred that the thickness of the second inorganic insulating layer 122 is more than about 1000 Å to about 5000 Å. For example, when the thickness of the gate electrode 105 is about 1000 Å and the thickness of the gate insulating layer 109 is about 2000 Å, the thickness of the second inorganic insulating layer 122 is more than about 3000 Å, for example, 3100 Å. Accordingly, the disconnection of the second inorganic insulating layer 122 at the step portion can be prevented.

A mask process is performed for the second inorganic insulating layer 122. The mask process may include a photoresist deposition process, a light exposure process, a developing process, an etching process and a stripping process. Through the mask process, the second inorganic insulating layer 122 is patterned to have an active contact hole 123 exposing each of both side portions of the auxiliary active layer 118. The second inorganic insulating layer 122 is referred to as the insulating interlayer 122.

A portion of the insulating interlayer 122 disposed over and covering a center portion of the auxiliary active layer 118 functions as an etch stopper.

The active hole 123 is formed, for example, through a dry etching for the insulating interlayer 122. In the dry etching, the auxiliary active layer 118 made of the intrinsic amorphous silicon is exposed to the dry etching condition. However, an etching gas for an inorganic insulating material is different from an etching gas for a semiconductor material. For example, a tetrafluoromethane ($CF_4$) gas, a trifluoromethane ($CF_3$) gas, a difluoromethane ($CF_2$) gas or the like is used for silicon nitride (SiNx) or silicon oxide ($SiO_2$) while a chlorine ($Cl_2$) gas, a boron trichloride ($BCl_3$) gas or the like is used for amorphous silicon or polycrystalline silicon.

Accordingly, the etching gas for the inorganic insulating material hardly affects the semiconductor material, and also, the etching gas for the semiconductor material hardly affects the inorganic insulating material. Thus, even when the auxiliary active layer 118 is exposed to the dry etching condition to form the active hole 123 in the insulating interlayer 122, this dry etching hardly causes variation of the thickness of the auxiliary active layer 118.

Further, even though variation of the thickness of the auxiliary active layer 118 is caused, the portion of the auxiliary active layer 118 below the active hole 123 is a portion that does not function as a channel of the thin film transistor Tr. Accordingly, the thickness variation of the active layer 118 is not problematic.

Further, when the thin film transistor Tr is in a turned-on state, a channel is substantially formed in the active layer 115 made of the polycrystalline silicon. Accordingly, the thickness variation of the active layer 119 is not problematic.

Referring to FIG. 4J, a second extrinsic amorphous silicon layer is formed on the insulating interlayer 122. The second extrinsic amorphous silicon layer may have a thickness of about 100 Å to about 300 Å. A cleaning process, for example, a BOE cleaning process may be performed before forming the second extrinsic amorphous silicon layer. According to the cleaning process, an oxide film, which might be produced at a surface of the auxiliary active layer 118 when the auxiliary active layer 118 is exposed to an air through the active contact hole 123, can be completely removed. Further, since the auxiliary active layer 118 is exposed to an air at a room temperature, it may not be inevitable that an oxide film as in a crystallization process is produced. Accordingly, when the second extrinsic amorphous silicon layer is deposited immediately after the active contact hole 123 is formed, the BOE cleaning process may be omitted.

A first metal layer is formed on the second extrinsic amorphous silicon layer. The first metal material may include molybdenum (Mo), chromium (Cr) or molybdenum-titanium (MoTi) but not limited thereto.

The first metal layer and the second extrinsic amorphous silicon layer are patterned through a mask process to form a data line 130 and a data pad electrode 138 at an end of the data line 130. The data line 130 is formed between neighboring pixel regions P, and the data pad electrode 138 is formed in the data pad region DPA. Further, through the mask process, source and drain electrodes 133 and 136 and an ohmic contact layer 127 are formed in the switching region TrA. The ohmic contact layer 127 made of the extrinsic amorphous silicon contacts the auxiliary active layer 118 through the active hole 123.

The source electrode 133 extends from the data line 130, and the drain electrode 136 is spaced apart from the source electrode 133. The source and drain electrodes 133 and 136 may have substantially the same shape and area in plane as the ohmic contact layer 127 therebelow.

A dummy pattern 128 made of the extrinsic amorphous silicon is formed below the data line 130 and the data pad electrode 138.

As described above, the center portion of the active layer 115 and the auxiliary active layer 118 is covered by the portion of the insulating interlayer 122 i.e, the etch stopper. Accordingly, the active layer 115 and the auxiliary active layer 118 are prevented from being damaged in the patterning process, for example, a dry etching process to form the ohmic contact layer 127. Therefore, prevented can be surface damage of the active layer 115 as a channel of the thin film transistor Tr due to the dry etching to form the ohmic contact layer. Further, prevented can be thickness reduction of the active layer 115.

Through the above-described processes, the gate electrode 105, the gate insulating layer 109, the active layer 115, the auxiliary active layer 118, the insulating interlayer 122, the ohmic contact layer 127 and the source and drain electrodes 133 and 136 are formed in the switching region TrA, and these components form the thin film transistor Tr.

Referring to FIG. 4K, a first passivation layer 140 is formed on the substrate 101 having the source and drain electrodes 133 and 136. The first passivation layer 140 may be made of an inorganic insulating material that includes silicon oxide ($SiO_2$) and silicon nitride (SiNx) but limited thereto.

The first passivation layer 140, the insulating interlayer 140 and the gate insulating layer 109 are patterned through a mask process to form a gate contact hole 142 exposing the gate electrode 105.

Referring to FIG. 4L, a second metal layer is formed on the first passivation layer 140 having the gate contact hole 142. The second metal material may include aluminum (Al), aluminum alloy (e.g., AlNd), copper (Cu), copper alloy, molybdenum (Mo) and chromium (Cr) but not limited thereto.

The second metal layer is patterned in a mask process to form a gate line 145 and a gate pad electrode 147 at an end of the gate line 145. The gate line 145 contacts the gate electrode 105 through the gate contact hole 142. The gate pad electrode 147 is formed in the gate pad region GPA.

The gate electrode 145 and the gate pad electrode 147 may have a single-layered structure or multiple-layered structure using the above-mentioned metal material. For example, a double-layered structure is formed using aluminum alloy/ molybdenum (AlNd/Mo), or a triple-layered structure is formed using molybdenum/aluminum alloy/molybdenum (Mo/AlNd/Mo).

Referring to FIG. 4M, a second passivation layer 150 is formed on the substrate 101 having the gate line 145. The second passivation layer 150 may be made of an inorganic insulating material that includes silicon oxide ($SiO_2$) and silicon nitride (SiNx) but not limited thereto.

A mask process is performed to pattern the first and second passivation layers 140 and 150 thus a drain contact hole 152 exposing the drain electrode 136 and a data pad contact hole 156 exposing the data pad electrode 138 are formed. Further, in the mask process, the second passivation layer 150 is patterned thus a gate pad contact hole 154 exposing the gate pad electrode 147 is formed.

Referring to FIG. 4N, a transparent conductive material is deposited and patterned in a mask process to form a pixel electrode 170 in the pixel region P, a gate pad electrode terminal 172 in the gate pad region GPA and a data pad electrode terminal 174 in the data pad region DPA. The pixel electrode 170 contacts the drain electrode 136 through the drain contact hole 152. The gate pad electrode terminal 172 contacts the gate pad electrode 147 through the gate pad contact hole 154. The data pad electrode terminal 174 contacts the data pad electrode 138 through the data pad contact hole 156. The transparent conductive material may include indium-tin-oxide (ITO), indium-zinc-oxide (IZO) and indium-tin-zinc-oxide (ITZO) but not limited thereto.

Through the above-described processes, the array substrate can be manufactured. The array substrate is coupled to an opposing substrate with a liquid crystal layer therebetween thus the LCD device can be manufactured.

The array substrate as described above can be used for other types of display devices, for example, an organic electroluminescent display (OELD). The OELD may include an array substrate having a structure similar to that of the LCD device. For example, the array substrate for the OELD may include the gate and data lines 145 and 130, the thin film transistor Tr, the pixel electrode 170 and the like, as described above. The thin film transistor Tr may be used as a driving thin film transistor of the OELD device, and a switching thin film transistor of the OELD may have a structure similar to that of the thin film transistor Tr. However, the drain contact hole 152 may not be formed over the switching thin film transistor of the OELD. A drain electrode of the switching thin film transistor of the OELD may be connected to a gate electrode of the driving thin film transistor of the OELD. Further, a power line connected to the driving thin film transistor of the OELD may be formed, for example, at the same process of forming the data line 130. An organic light emitting diode, which includes first and second electrodes and an organic light emitting layer therebetween, may be connected to the driving thin film transistor. Among the components of the organic light emitting diode, one of the first and second electrodes may correspond to the pixel electrode 170.

Figure 5:
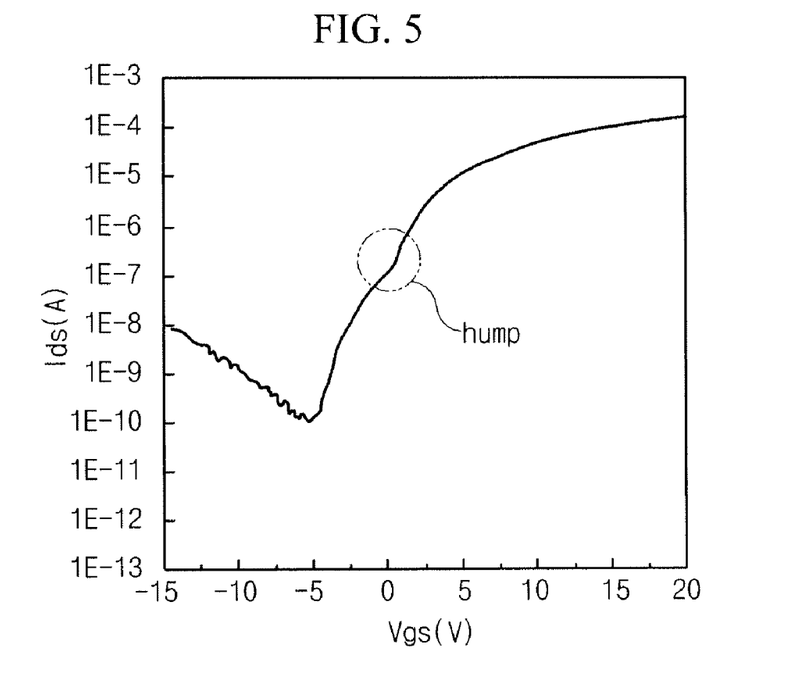
FIG. 5 shows an I-V curve of a thin film transistor only using an active layer of intrinsic polycrystalline silicon without an auxiliary active layer of intrinsic amorphous silicon.
Figure 6:
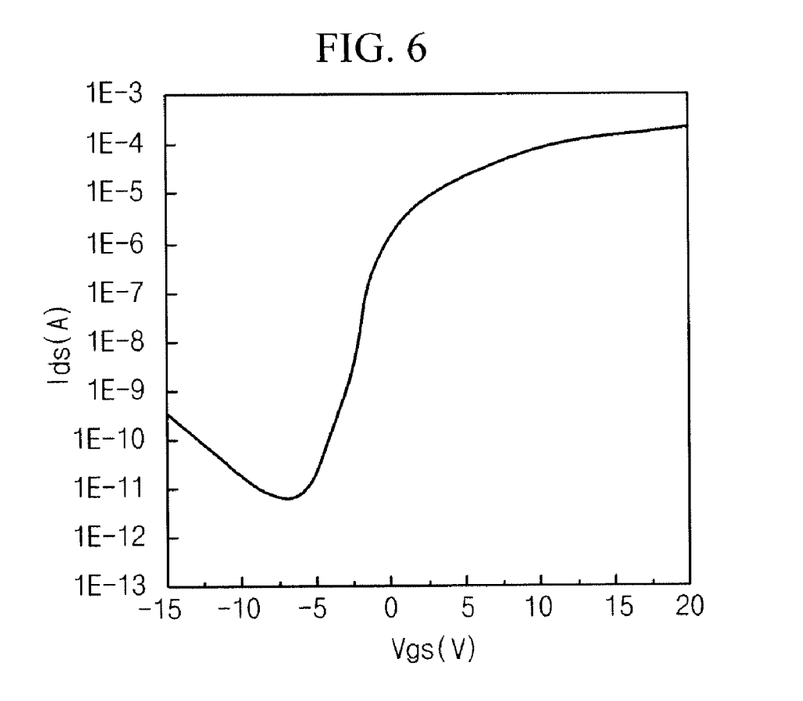
FIG. 6 shows an I-V curve of a thin film transistor according to the embodiment.

FIG. 5 shows an I-V (current-voltage) curve of a thin film transistor only using an active layer of intrinsic polycrystalline silicon without an auxiliary active layer of intrinsic amorphous silicon, and FIG. 6 shows an I-V curve of a thin film transistor according to the embodiment. In FIGS. 5 and 6, a reference "Vgs" indicates a gate-source voltage of the thin film transistor, and a reference "Ids" indicates a logarithmic value of a drain current of the thin film transistor. For brevity of explanation, the "Ids" is referred to as a drain current.

Referring to FIG. 5, a drain current Ids of about $1E^{-10}$ A flows at a gate-source voltage Vgs of about −5V. The drain current Ids increases roughly linearly in a section between about −5V to about 0V of the gate-source voltage Vgs, and this section is generally used to operate a thin film transistor. However, in the section of FIG. 5, a portion, referred to as a hump, where the curve is abnormally non-linear occurs. Due to the hump, it is problematic to use the thin film transistor of FIG. 5 as a switching element or a driving element.

However, referring to FIG. 6, the section between about −5V to about 0V is substantially linear without the hump of FIG. 5. Further, the drain current Ids of about $1E^{-11}$ A flows at a gate-source voltage Vgs of about −5V. In other words, the drain current Ids when a thin film transistor is turned off is about 10 times less than that of FIG. 5.

As a result, the thin film transistor of the embodiment has a property better than the thin film transistor of FIG. 5.

As described above, in the embodiment, the active layer is not exposed to the dry etching condition. Accordingly, the property degradation of the thin film transistor can be prevented.

Further, since the active layer is not affected by the dry etching, the thickness reduction of the active layer due to the dry etching is not needed to be considered. Accordingly, deposition amount and time of the material for the active layer can be reduced and thus production efficiency can be improved.

Further, since the thin film transistor uses the polycrystalline silicon as a semiconductor layer, properties, such as mobility, of the thin film transistor can be improved compared to the thin film transistor using the amorphous silicon.

Further, the active layer of the polycrystalline silicon and the auxiliary active layer of the amorphous silicon are used together. The on current flow when the thin film transistor is in the turned-on state is formed dominantly in the active layer. The off current when the thin film transistor is in the turned-off state is effected by the auxiliary active layer, and thus the off current is maintained at a low level compared to the thin film transistor only using the polycrystalline silicon. Accordingly, performance of the thin film transistor can be improved in both of the turned-on and off states.

Further, even though the thin film transistor uses the active layer of the polycrystalline silicon, an ion doping process of the related art is not needed. Accordingly, costs such as investment for an ion doping apparatus is not required additionally. Therefore, production costs can be saved.

Further, the gate electrode is made of the polycrystalline silicon. Accordingly, prevented can be a problem that, when the gate electrode is made of metal, the gate electrode is deformed or short-circuited with the semiconductor layer by spikes of the gate electrode, during the crystallization by the SPC process.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a display device, the method comprising:

forming a buffer layer on a substrate and made of an inorganic insulating material;

forming a gate electrode, a gate insulating layer, an active layer and an auxiliary active layer sequentially disposed on the buffer layer, wherein the gate electrode and the gate insulating layer have substantially the same shape and area in plane, wherein the active layer and the auxiliary active layer have substantially the same shape and area in plane, wherein side portions of the gate insulating layer are not covered by the active layer, wherein the gate electrode is made of extrinsic polycrystalline silicon, wherein the active layer is made of intrinsic polycrystalline silicon, and wherein the auxiliary active layer is made of intrinsic amorphous silicon;

forming an insulating interlayer on the auxiliary active layer and made of an inorganic insulating material, wherein the insulating interlayer includes an active contact hole exposing each of both side portions of the auxiliary active layer;

forming an ohmic contact layer, source and drain electrodes and a data line, wherein the ohmic contact layer is made of extrinsic amorphous silicon and contacts each of the both side portions of the auxiliary active layer, wherein each of the source and drain electrodes is on the ohmic contact layer, and wherein the data line is on the insulating interlayer;

forming a first passivation layer on the source and drain electrodes and the data line;

patterning the first passivation layer, the insulating interlayer and the gate insulating layer to form a gate contact hole exposing the gate electrode;

forming a gate line on the first passivation layer, made of a metal material, crossing the data line to define a pixel region, and contacting the gate electrode through the gate contact hole;

forming a second passivation layer on the gate line;

patterning the first and second passivation layers to form a drain contact hole exposing the drain electrode; and forming a pixel electrode on the second passivation layer in the pixel region and contacting the drain electrode through the drain contact hole.

2. The method according to claim 1, wherein forming the gate electrode, the gate insulating layer, the active layer and the auxiliary active layer includes:
- forming a first extrinsic amorphous silicon layer, a first inorganic insulating layer and a first intrinsic amorphous silicon layer sequentially on the buffer layer;
- performing a solid phase crystallization (SPC) to modify the first extrinsic amorphous silicon layer and the first intrinsic amorphous silicon layer into an extrinsic polycrystalline silicon layer and an intrinsic polycrystalline silicon layer, respectively;
- forming a second intrinsic amorphous silicon layer on the intrinsic polycrystalline silicon layer;
- forming first to third photoresist patterns on the second intrinsic amorphous silicon layer, wherein the first photoresist pattern has a first thickness, wherein the second and third photoresist patterns are located at both sides of the first photoresist pattern and have a second thickness less than the first thickness;
- patterning the second intrinsic amorphous silicon layer, the intrinsic polycrystalline silicon layer, the first inorganic insulating layer and the extrinsic polycrystalline silicon layer using the first to third photoresist patterns to form the gate electrode made of the extrinsic polycrystalline silicon, the gate insulating layer, an intrinsic polycrystalline silicon pattern, and an intrinsic amorphous silicon pattern;
- performing an ashing process to remove the second and third photoresist patterns;
- removing the intrinsic amorphous silicon pattern and the intrinsic amorphous silicon pattern below the removed second and third photoresist patterns to form the active layer and the auxiliary active layer; and
- removing the first photoresist pattern.

3. The method according to claim 2, wherein the SPC is a thermal crystallization using a thermal treatment or an alternating magnetic field crystallization using an alternating magnetic field crystallization apparatus.

4. The method according to claim 2, further comprising performing a buffered oxide etch (BOE) cleaning for the intrinsic polycrystalline silicon layer before forming the second intrinsic amorphous silicon layer.

5. The method according to claim 1, further comprising performing a buffered oxide etch (BOE) cleaning for the auxiliary active layer exposed through the active contact hole before forming the ohmic contact layer.

6. The method according to claim 1, wherein forming the source and drain electrodes and the data line includes forming a data pad electrode at an end of the data line, wherein forming the gate line includes forming a gate pad electrode at an end of the gate line, wherein patterning the first and second passivation layers includes patterning the first and second passivation layers to form a data pad contact hole exposing the data pad electrode and patterning the second passivation layer to form a gate pad contact hole exposing the gate pad electrode, and wherein forming the pixel electrode includes forming a gate pad electrode terminal contacting the gate pad electrode through the gate pad contact hole and a data pad electrode terminal contacting the data pad electrode through the data pad contact hole.

7. The method according to claim 1, wherein the gate electrode has a thickness of about 500 Å to 1000 Å, wherein the active layer has a thickness of about 300 Å to about 1000 Å, wherein the auxiliary active layer has a thickness of about 50 Å to about 300 Å, and wherein the insulating interlayer has a thickness more than a total thickness of the gate electrode and the gate insulating layer.

8. A display device, comprising:
- a buffer layer on a substrate and made of an inorganic insulating material;
- a gate electrode and a gate insulating layer sequentially disposed on the buffer layer and having substantially the same shape and area in plane, wherein the gate electrode is made of extrinsic polycrystalline silicon;
- an active layer and an auxiliary active layer sequentially disposed on the gate insulating layer and having substantially the same shape and area in plane, wherein side portions of the gate insulating layer are not covered by the active layer, wherein the active layer is made of intrinsic polycrystalline silicon, and wherein the auxiliary active layer is made of intrinsic amorphous silicon;
- an insulating interlayer on the auxiliary active layer, wherein the insulating interlayer includes an active contact hole exposing each of both side portions of the auxiliary active layer;
- an ohmic contact layer contacting each of the both side portions of the auxiliary active layer and made of extrinsic amorphous silicon;
- source and drain electrodes on each of the ohmic contact layer;
- a data line on the insulating interlayer;
- a first passivation layer on the source and drain electrodes and the data line and including a gate contact hole exposing the gate electrode;
- a gate line on the first passivation layer, crossing the data line to define a pixel region, and contacting the gate electrode through the gate contact hole;
- a second passivation layer on the gate line and including a drain contact hole exposing the drain electrode; and
- a pixel electrode on the second passivation layer in the pixel region and contacting the drain electrode through the drain contact hole.

9. The device according to claim 8, wherein the gate electrode has a thickness of about 500 Å to 1000 Å, wherein the active layer has a thickness of about 300 Å to about 1000 Å, wherein the auxiliary active layer has a thickness of about 50 Å to about 300 Å, and wherein the insulating interlayer has a thickness more than a total thickness of the gate electrode and the gate insulating layer.

10. The device according to claim 8, further comprising:
- a gate pad electrode at an end of the gate line;
- a data pad electrode at an end of the data line; and
- a gate pad electrode terminal and a data pad electrode terminal on the second passivation layer and made of the same material as the pixel electrode,
- wherein the second passivation layer includes a gate pad contact hole though which the gate pad electrode contacts the gate pad electrode terminal, and the first and second passivation layers include a data pad contact hole through which the data pad electrode contacts the data pad electrode terminal.

* * * * *